United States Patent
Chung et al.

(10) Patent No.: US 7,830,692 B2
(45) Date of Patent: Nov. 9, 2010

(54) MULTI-CHIP MEMORY DEVICE WITH STACKED MEMORY CHIPS, METHOD OF STACKING MEMORY CHIPS, AND METHOD OF CONTROLLING OPERATION OF MULTI-CHIP PACKAGE MEMORY

(75) Inventors: Hoe-ju Chung, Yongin-si (KR); Jung-bae Lee, Yongin-si (KR); Uk-song Kang, Yongin-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 85 days.

(21) Appl. No.: 12/238,720

(22) Filed: Sep. 26, 2008

(65) Prior Publication Data

US 2009/0091962 A1  Apr. 9, 2009

(30) Foreign Application Priority Data

Oct. 4, 2007 (KR) .................. 10-2007-0099876

(51) Int. Cl.
*G11C 5/62* (2006.01)
(52) U.S. Cl. .......................... 365/51; 365/63
(58) Field of Classification Search .................. 365/51, 365/63
See application file for complete search history.

(56) References Cited

U.S. PATENT DOCUMENTS 7,330,368 B2 * 2/2008 Saito et al. ..................... 365/63
7,466,577 B2 * 12/2008 Sekiguchi et al. ............. 365/51

FOREIGN PATENT DOCUMENTS

| JP | 2004327474 A | 11/2004 |
| JP | 2006012337 A | 1/2006 |
| JP | 2006013337 A | 1/2006 |
| JP | 2006277870 A | 10/2006 |

* cited by examiner

*Primary Examiner*—Michael T Tran
(74) *Attorney, Agent, or Firm*—Volentine & Whitt, P.L.L.C.

(57) ABSTRACT

A multi-chip memory device includes a transfer memory chip communicating input/output signals, a stacked plurality of memory chips each including a memory array having a designated bank, and a signal path extending upward from the transfer memory chip through the stack of memory chips to communicate input/output signals, wherein each bank of each memory chip in the stacked plurality of memory chips is commonly addressed to provide read data during a read operation and receive write data during a write operation, and vertically aligned within the stacked plurality of memory chips.

22 Claims, 9 Drawing Sheets

MULTI-CHIP MEMORY DEVICE WITH STACKED MEMORY CHIPS, METHOD OF STACKING MEMORY CHIPS, AND METHOD OF CONTROLLING OPERATION OF MULTI-CHIP PACKAGE MEMORY

CROSS-REFERENCE TO RELATED PATENT APPLICATION

This application claims the benefit of Korean Patent Application No. 10-2007-0099876 filed on Oct. 4, 2007, the subject matter of which is hereby incorporated by reference.

BACKGROUND OF THE INVENTION

1. Field of the Invention

The present invention relates generally to a multi-chip memory device, and more particularly to a multi-chip memory device formed from a stacked plurality of memory chips. The invention also relates to a method of stacking the plurality of memory chips to form the multi-chip memory device, and a method of controlling the operation of the multi-chip memory device.

2. Description of the Related Art

As electronic portable products have become smaller in size, constituent semiconductor devices within the products have generally become smaller and lighter while providing enhanced functionality. One approach to reducing the area occupied by finished semiconductor packages involves fabricating such packages to include a stacked plurality of semiconductor chips. In the case of multi-chip semiconductor devices, a plurality of memory chips are stacked one on top of the other to provide increased data storage capacity and/or available data bandwidth per unit surface area occupied by the device. Additionally or alternately, memory chips and non-memory chips may be combined in a single stacked package to implement multiple system or sub-system functionality.

In this context, the term "stacked" refers broadly to a class of semiconductor devices that vertically mount one semiconductor chip (e.g., a naked semiconductor die or a partially or fully packaged die) on top of another. The designated "vertical" orientation of the resulting stack is merely a relative term drawn in relation to an assumed horizontal disposition of a principal plane defined by the substrate implementing a semiconductor chip.

In the context of a stacked memory device, multiple memory chips may be stacked one on top of the other or multiple memory chips may be stacked on a corresponding interface chip that implements certain control functions associated with the communication (read/write(or program)/erase) of data to/from one or more of the stacked memory chips.

Memory chips may be stacked mounted one on top of the other using a number of different connection techniques. For example, when stacking first and second memory chips, each memory chip may include a pad that is electrically connected to a bonding wire. This connection technique is quite common in conventional multi-chip package memories.

Alternately, these memory chips may be stacked mounted one on top of the other using so-called "through silicon via" (TSV) techniques. As is conventionally understood, TSVs may be formed through respective semiconductor chip substrates to implement serial and/or parallel signal paths traversing part or all of a stacked plurality of semiconductor chips.

SUMMARY OF THE INVENTION

Embodiments of the invention provide a stacked multi-chip memory device and related methods of fabrication and operation that more efficiently control read/write operations in the stacked memory device using signal paths implemented, at least in part, by through silicon vias (TSVs).

In one embodiment, the invention provides a multi-chip memory device comprising; a transfer memory chip communicating input/output signals, a stacked plurality of memory chips disposed on the transfer memory chip, wherein each one of the stacked plurality of memory chips comprises a memory array having a designated bank, and a signal path extending upward from the transfer memory chip through the stacked plurality of memory chips to communicate at least one of the input/output signals to each bank of each memory chip in the stacked plurality of memory chips, wherein respective banks of each memory chip in the stacked plurality of memory chips are commonly addressed to provide read data during a read operation and receive write data during a write operation, and vertically aligned within the stacked plurality of memory chips.

In another embodiment, the invention provides a multi-chip memory device comprising; a transfer memory chip communicating input/output signals, a stacked plurality of N memory chips disposed on the transfer memory chip, wherein each one of the N memory chips comprises a memory array having a plurality of M designated banks, and M signal paths respectively extending upward from the transfer memory chip through the stacked plurality of N memory chips to communicate input/output signals to respective, commonly addressed and vertically aligned banks in each one of the N memory chips to provide read data during a read operation and receive write data during a write operation.

In another embodiment, the invention provides a method of fabricating a multi-chip memory device, comprising; stacking a plurality of N memory chips on a transfer memory chip, wherein each one of the N memory chips comprises a memory array having a plurality of M designated banks, and providing M signal paths respectively extending upward from the transfer memory chip through the stacked plurality of N memory chips to communicate input/output signals to respective, commonly addressed and vertically aligned banks in each one of the N memory chips to provide read data during a read operation and receive write data during a write operation.

In another embodiment, the invention provides a method of controlling operation of a multi-chip memory device comprising a stacked plurality of N memory chips, wherein each one of the N memory chips comprises a memory array having a plurality of M designated banks, and M signal paths respectively extending upward from a transfer memory chip through the stacked plurality of N memory chips communicates input/output signals to respective, commonly addressed and vertically aligned banks in each one of the N memory chips, the method comprising; receiving a read command and a corresponding address associated with a read operation in the transfer memory chip, using a corresponding one of the M signal paths, commonly addressing one bank of the M designated banks in each one of the stacked plurality of N memory chips using the address, and sequentially outputting to the transfer memory chip a block of read data from each one of the commonly addressed banks in each one of the stacked plurality of N memory chips using the corresponding one of the M signal paths.

In another embodiment, the invention provides a method of controlling operation of a multi-chip memory device comprising a stacked plurality of N memory chips, wherein each one of the N memory chips comprises a memory array having a plurality of M designated banks, and M signal paths respectively extending upward from a transfer memory chip through the stacked plurality of N memory chips communicates input/output signals to respective, commonly addressed and vertically aligned banks in each one of the N memory chips, the method comprising; receiving a write command and a corresponding address associated with a write operation in the transfer memory chip, using a corresponding one of the M signal paths, commonly addressing one bank of the M designated banks in each one of the stacked plurality of N memory chips using the address, and sequentially writing a block of write data in each one of the commonly addressed banks in each one of the stacked plurality of N memory chips using the corresponding one of the M signal paths.

DESCRIPTION OF EMBODIMENTS

Embodiments of the invention will now be described with reference to the accompanying drawings. However, the invention may be variously configured and should not be construed as being limited to only the illustrated embodiments which are presented as teaching examples. Throughout the written description and drawings like reference indicators are used for like or similar elements.

In one embodiment of the invention, a multi-chip memory device comprises a transfer memory chip upon which a stacked plurality of 1st through Nth memory chips is stack mounted. Command/control, address, and/or data signals (C/A/D) are communicated to/from the transfer memory chip via signal paths implemented, at least in part by a plurality of through silicon vias (TSVs). Hereafter, any combination of C/A/D signals and/or related clock signals associated with the stacked plurality of memory chips will be generically referred to as "input/output signals". Output signals received from the stacked plurality of memory chips by the transfer memory chip are communicated to external circuitry. In similar vein, input signals communicated by the transfer memory chip to stacked plurality of memory chips are externally provided or derived within the transfer memory chip from externally provided signals.

In certain embodiments of the invention, each one of the stacked plurality of 1st to Nth memory chips comprises an arrangement of memory banks. That is, the array of memory cells provided by each memory chip is defined in its operative nature and/or physical layout to implement a bank-by-bank designation and division of the memory array. This type of designation and operational division is conventionally understood in single chip memory devices. In one embodiment of the invention, the respective memory bank arrangements provided by first and second memory chips in a stacked plurality of memory chips will be vertically aligned within the stack. That is, two or more of the 1st to Nth memory chips in the stacked plurality of memory chips are disposed such that memory cell locations within each memory bank (i.e., one or more specific memory cells identified by a similar address), are vertically aligned within the stack. Here again, the term "vertically aligned" is used in relation to the "vertical" stacking direction of the plurality of memory chips on the memory transfer chip. Hence, corresponding memory bank portions (or corresponding memory cells within a memory bank) for the first and second memory chips will be intersected by a common vertical line drawn from an uppermost memory chip to a lowermost memory chip in the stack.

Each memory chip in the stacked plurality of memory chips comprises an upper primary surface upon which one or more electrical elements (e.g., circuits, components, signal lines, etc.) is formed. Each memory chip in the stacked plurality of memory chips also comprises a lower primary surface opposite the upper surface. The lower surface may or may not include electrical elements.

TSVs may be used to implement signal paths connecting electrical elements disposed on the upper and/or lower surfaces of different memory chips within the stacked plurality of memory chips.

Figure 1:
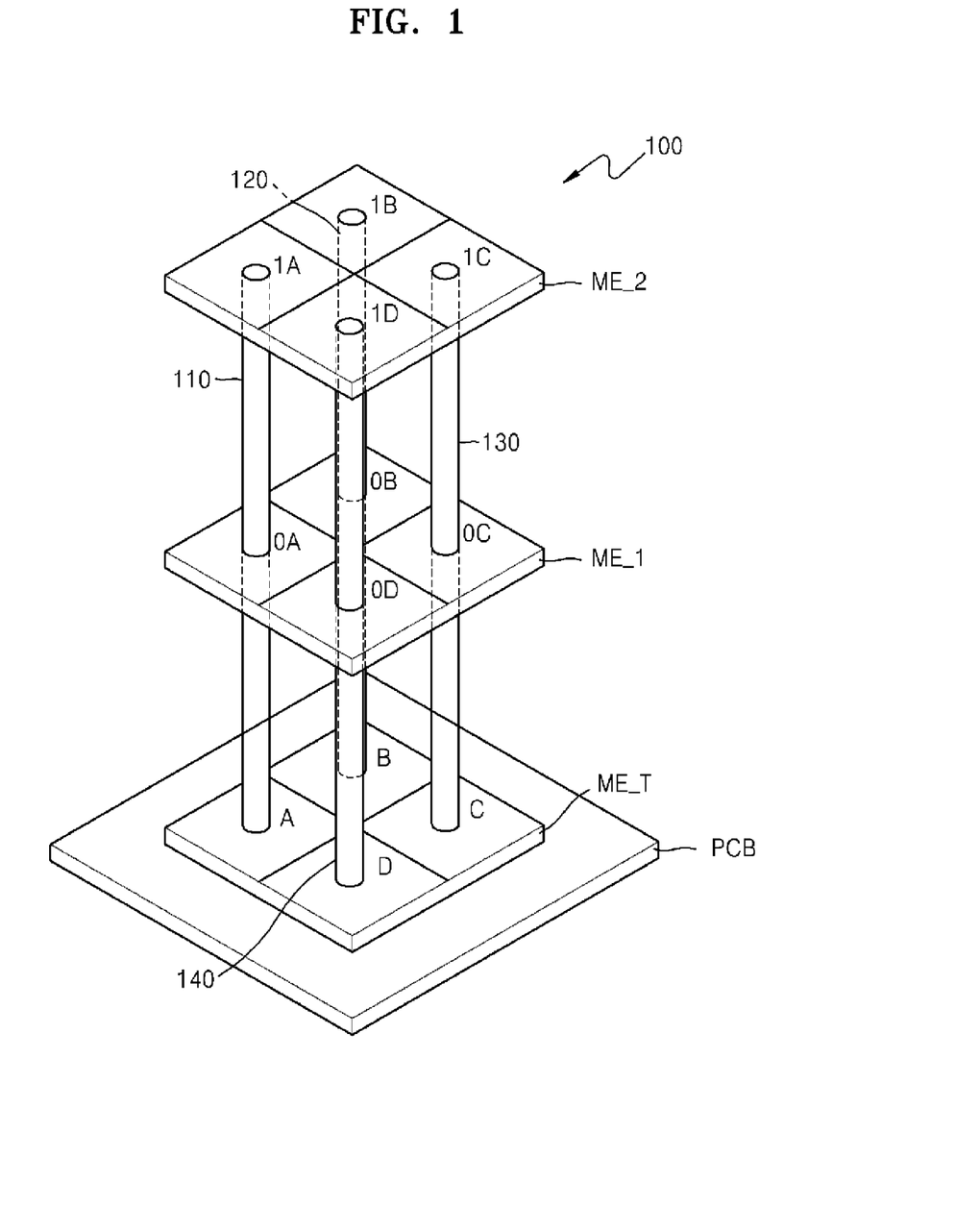
FIG. 1 is a perspective view illustrating a multi-chip memory device according to an embodiment of the invention.
Figure 2:
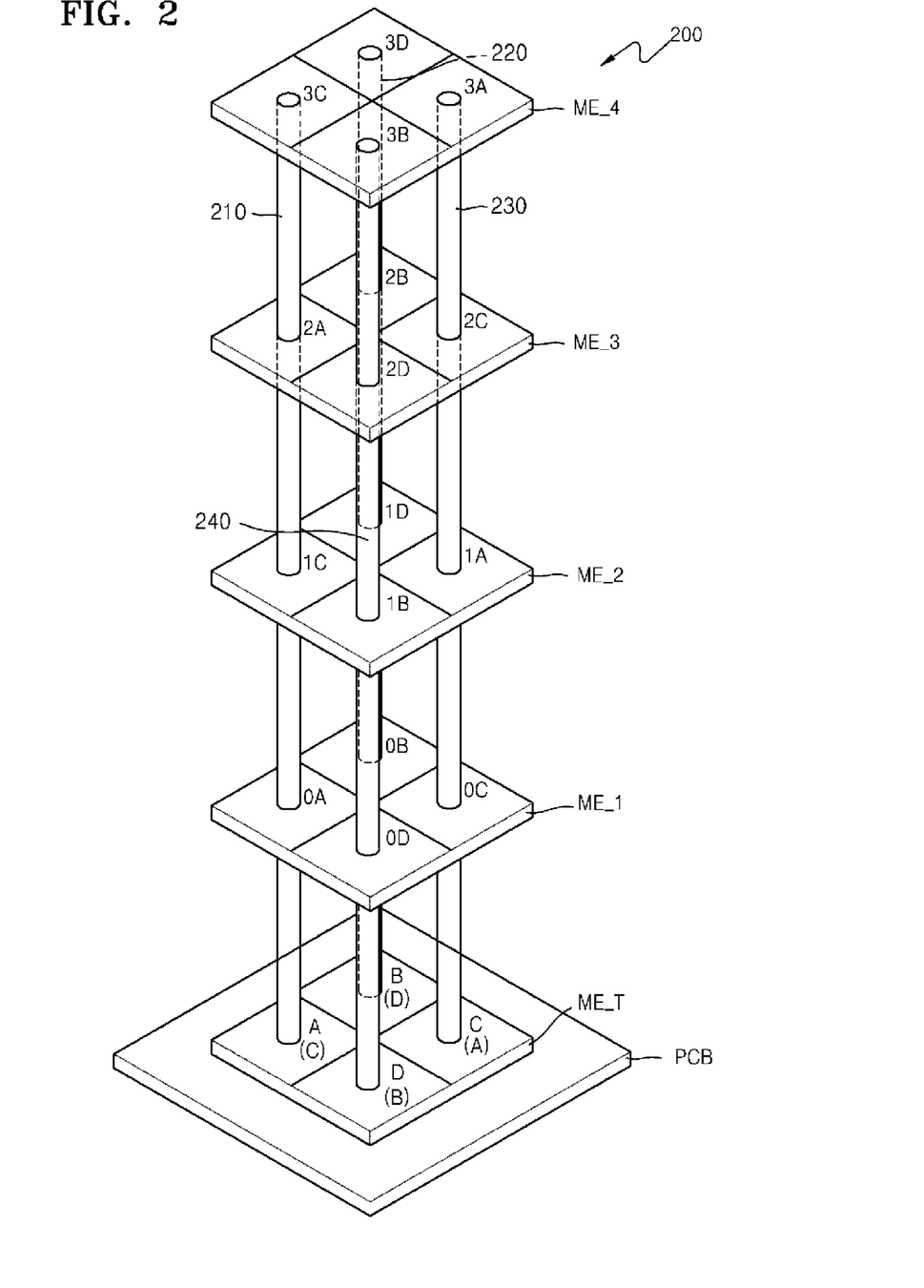
FIG. 2 is a perspective view illustrating a multi-chip memory device according to another embodiment of the invention.

In FIG. 1, a multi-chip memory device 100 according to an embodiment of the invention is illustrated and comprises a transfer memory chip ME_T mounted on a printed circuit board (PCB), and 1st and 2nd memory chips ME_1 and ME_2 stacked on transfer memory chip ME_T. In FIG. 2, a multi-chip memory device 200 according to another embodiment of the invention is illustrated and comprises a transfer memory chip ME_T mounted on a PCB, and 1st, 2nd, 3rd and 4th memory chips ME_1, ME_2, ME_3 and ME_4 stacked on transfer memory chip ME_T. Any reasonable number of memory chips may be stacked in this manner. Thus, in the description that follows the first and second memory chips described may be considered, a lower and an upper memory chip anywhere within a stacked plurality of memory chips.

Accordingly, an understanding of the embodiment shown in FIG. 2 may be faithfully extrapolated from the following description on the embodiment shown in FIG. 1. It just shows more memory chips in the stack.

With reference to FIG. 1, multi-chip memory device 100 comprises transfer memory chip ME_T, and 1st and 2nd memory chip ME_1 and ME_2. Four signal paths 110, 120, 130 and 140 are shown vertically traversing the stack, as implemented in part using TSVs. Clearly, the practical provision of input/output signals between transfer memory chip ME_T and one or both of 1st and 2nd memory chip ME_1 and ME_2 requires a number of signal line buses (e.g., designated collections of parallel signal lines) as well as various individual signal lines, but for purposes of clarity, only four generic signal paths 110, 120, 130 and 140 are illustrated.

In various embodiments of the invention, the transfer memory chip ME_T may be implemented as an interface chip, a memory controller or a central processing unit (CPU).

In the illustrated embodiment of FIG. 1, the 1st memory chip ME_1 comprises a memory array arranged in four banks 0A, 0B, 0C and 0D, and the memory array of 2nd memory chip ME_2 similarly comprises four banks 1A, 1B, 1C and 1D. However, it will be apparent to those skilled in the art that the memory array of each memory chip in a stacked plurality of memory chips may include any reasonable number and arrangement of banks.

Thus, in FIG. 1, each memory chip comprises four banks, A through D, each respectively associated with a corresponding signal path 110, 120, 130 and 140. That is, each signal path 110, 120, 130 and 140 extends upward from the transfer memory chip ME_T through the stack to electrically connect a corresponding one of the plurality of banks designated in each memory chip. For example, first signal path 110 may be used to communicate input/output signals from first bank 0A and/or first bank 1A of the respective 1st and 2nd memory chips ME_1 and ME_2 to a first control portion "A" of transfer memory chip ME_T. First portion A of transfer memory chip ME_T may include, for example, the logic, driver, and/or buffer circuitry necessary to facilitate the receipt and provision of input/output signals to all or respective ones of the first banks in the plurality of memory chips.

In the illustrated arrangement of FIG. 1, respective first backs 0A and 1A are disposed in a stacked relationship above (i.e., in vertical alignment with) the corresponding first portion A of transfer memory chip ME_T. The plurality of 1st and 2nd memory chips ME_1 and ME_2 are operatively arranged, such that the respective first banks 0A and 1A include memory cells that are accessed by similar addresses. Thus, memory cells that are at least partially addressed in a similar manner are vertically aligned at least in a bank-by-bank manner within the stacked plurality of memory chips. Accordingly, first signal path 110 may be used to provide respective first banks 0A and 1A with common address signals. In similar manner, second banks 0B and 1B share common address signals provided by second signal path 120, etc. Not only address signals, but also command and control as well as data signals may traverse a common signal path provided in relation to a vertically aligned collection of banks in a stacked plurality of memory chips.

For example, when the data being read from multiple banks of different memory chips in response to an address signal applied to the multiple banks by a common signal path, the read data from each bank may be provided in relation to a predetermined burst length. For example, read data from respective first banks 0A and 1A may be obtained when a read command is applied to 1st and 2nd memory chips ME_1 and ME_2 through signal path 110. Thus, a resulting first block of read data from first bank 0A may be transferred by first signal path 110 in a first data window temporally accommodating the first block of read data. Thereafter, a resulting second block of read data from first bank 1A may be transferred by first signal path 110 in a second data window temporally accommodating the second block of read data. The concatenation of the first and second blocks of read data via first signal path 110 will result in read data having a number of data bits consistent with the defined burst length.

In contrast, write data must be coherently divided between banks within the stacked plurality of memory chips in accordance with a given burst length (of "B" data bits) and a common write address. For example, a block of write data may be written to banks 0A and 1A when a write command and corresponding write data are communicated via first signal path 110 by transfer memory chip ME_T. A first block of write data (i.e., one-half the burst length definition in the working example) is written in first bank 0A and a residual second block of write data is written in first bank 1A.

In this manner, read/write operations may respectively read and write data to multiple banks within the stacked plurality of memory chips in accordance with a given burst length definition and using a common address applied through a common signal path associated with the multiple banks. Given the embodiment of FIG. 1, data blocks equal to one-half of the defined burst length may be stored in respective banks, whereas data blocks equal to one-fourth the defined burst length may be stored in each bank in the embodiment of FIG. 2.

Figure 3:
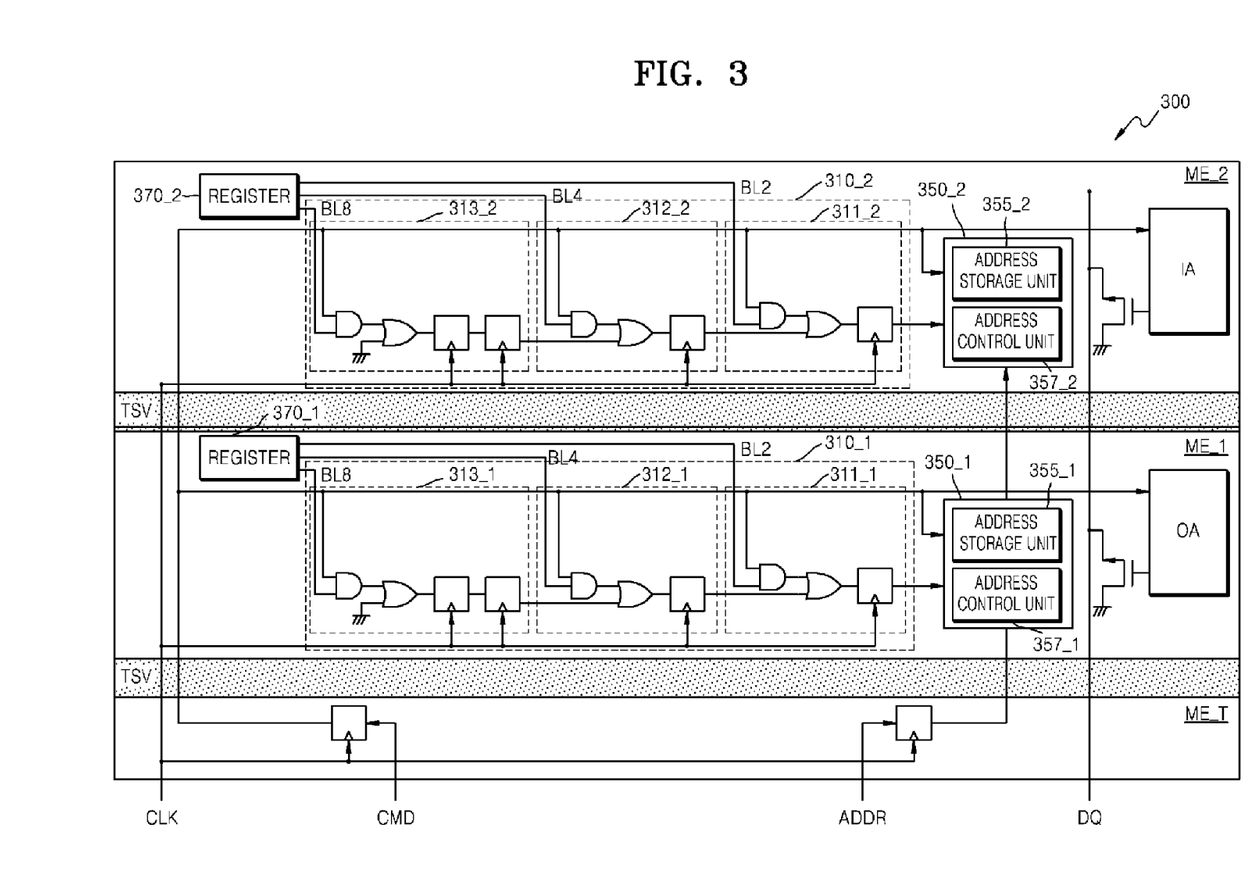
FIG. 3 is a circuit diagram illustrating read/write operations directed to data stored in a memory bank using command/address/data signals applied to the multi-chip memory device of FIG. 1.

FIG. 3 is a circuit diagram further illustrating the implementation of read/write operations directed to data to be read from or written to first banks 0A and 1A of the stacked plurality of memory chips in the multi-chip memory device of FIG. 1.

With reference to FIG. 3, the 1st memory chip ME_1 comprises a command control unit 310_1, an address transfer unit 350_1, and a register 370_1. The 2nd memory chip ME_2 comprises a command control unit 310_2, an address transfer unit 350_2, and a register 370_2.

When a clock signal CLK, an operation command CMD and an address ADDR are externally applied to the transfer memory chip ME_T, the transfer memory chip ME_T transfers these signals (or analogous signals derived from same) to the 1st memory chip ME_1 and/or the 2nd memory chip ME_2. The respective command control units 310_1 and 310_2 delay the read/write command CMD in response to delay control signals BL2, BL4 and BL8. Each one of these delay control signals is a signal corresponding to a defined delay for an applied read/write command CMD. For example, in one embodiment of the invention, each delay control signal corresponds to a particular burst length.

Each command control unit 310_1 and 310_2 determines the extent of the delay applied to the read/write command CMD in accordance with an applied delay control signal using information regarding burst length definition stored in registers 370_1 and 370_2. For example, when a burst length of 2 is defined, 1-bit of data is read from bank 0A in response to delay control signal BL2, and thereafter the read command is applied to the 2nd memory chip ME_2.

Thus, in the illustrated example, the command control unit 310_1 comprises a plurality of delay units 311_1, 312_1 and 313_1, and the command control unit 310_2 comprises a plurality of delay units 311_2, 312_2 and 313_2. The delay units 311_1, 312_1, 313_1, 311_2, 312_2 and 313_2 delay the read/write command, in response to applied delay control signals. Each delay unit may comprise a logic operation unit operating in response to an applied delay control signal and the read/write command, and a flip-flop delaying an output signal provided by the logic operation unit.

For example, when the burst length of data is 2, only delay unit 311_1 is enabled and the remaining delay units 312_1 and 313_1 are disabled. When the burst length of data is 8, all delay units 311_1, 312_1 and 313_1 are enabled. In FIG. 3, one exemplary logic operation unit may be formed using an AND gate and an OR gate. However, it will be apparent to those skilled in the art that any reasonable combination of logic gate and circuit components may be used to implement competent logic operation units within delay units 311_1, 312_1 and 313_1 which may be variously enabled/disabled. However implemented, the application of read/write commands to the respective 1st and 2nd memory chips ME_1 and ME_2 is delayed in such a manner that overlapping data output is avoided. That is, when the data is read from first bank 0A and first bank 1A is communicated via first signal path 110, respective output intervals are established to ensure stable data output.

The address transfer units 350_1 and 350_2 respectively transfer a common address to the 1st and 2nd memory chips ME_1 and ME_2 in response to the delayed read/write command. The address transfer unit 350_1 may comprise an address storage unit 355_1 and an address control unit 357_1, and the address transfer unit 350_2 may comprise an address storage unit 355_2 and an address control unit 357_2. The address storage 355_1 stores the address in response to the read/write command transferred to the 1st memory chip ME_1. That is, when the read/write command is applied to the 1st memory chip ME_1, the address is stored in the address storage unit 355_1. The address control unit 357_1 controls the stored address to be transferred to the 2nd memory chip ME_2, in response to the delayed read/write command. That is, when the delayed read/write command being output from the command control unit 310_1 is applied, the address transfer unit 350_1 transfers the address to the 2nd memory chip ME_2.

Figure 4A:
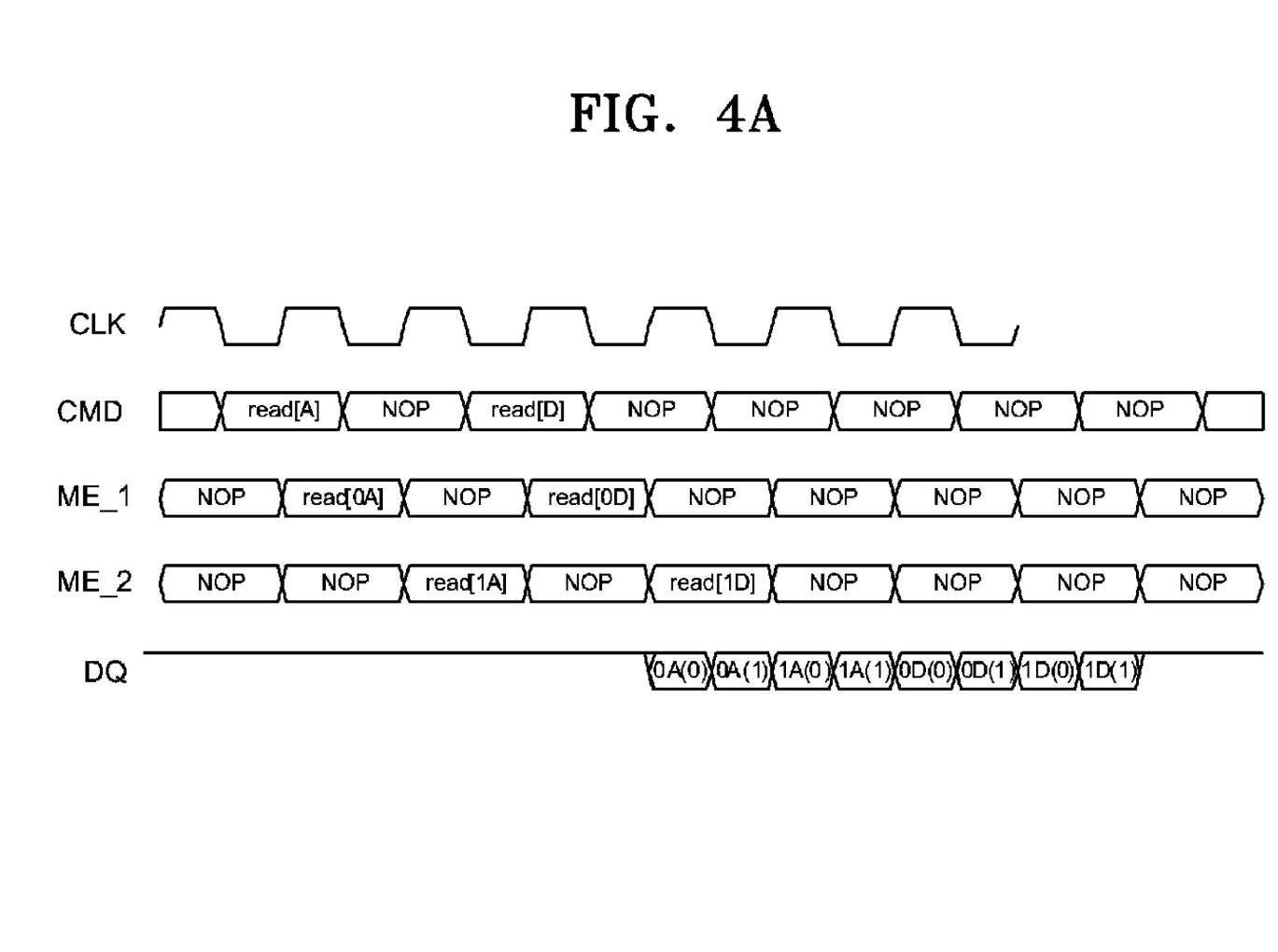
FIG. 4A is waveform diagram showing certain signals applied to the multi-chip memory device of FIG. 1 given a data burst length of 4.

FIG. 4A is a waveform diagram illustrating signals in the multi-chip memory device 100 of FIG. 1, assuming a data burst length of 4.

A read operation command (read[A]) applied to multi-chip memory device 100 will be described with reference to FIGS. 1, 3 and 4A. When the read operation read[A] is applied to multi-chip memory device 100, the transfer memory chip ME_T transfers the read operation read[A] to the 1st memory chip ME_1 via a signal path implemented using a TSV. In first bank 0A of the 1st memory chip ME_1 data 0A(0) and 0A(1) are read in response to the read operation read[A] and the corresponding address ADDR. Further, the address storage unit 355_1 stores the address ADDR in response to the read command read[A] and does not immediately transfer the address ADDR to the 2nd memory chip ME_2. While the data is read from bank 0A, command control unit 310_1 delays the read operation read[A]. That is, since the burst length is 4, delay units 312_1 and 311_1 are enabled so that the read operation read[A] is delayed. The delayed read operation read[A] is transferred to the 2nd memory chip ME_2, and the address control unit 357_1 controls the address ADDR to be transferred to the 2nd memory chip ME_2, in response to the delayed read operation read[A]. The 2nd memory chip ME_2 reads data 1A(0) and 1A(1) from first bank 1A, in response to the delayed read operation read[A] and the address ADDR.

FIG. 4A also shows a second read operation command read[D] following the first read operation read[A] directed to data stored in the fourth banks of the 1st and 2nd memory chips ME_1 and ME_2. Hence, in a following 4-bit data block data 0D(0) and 0D(1) is read from fourth bank 0D and following a commensurate delay fourth bank 1D using fourth signal path 140 is similar fashion as described above.

Figure 4B:
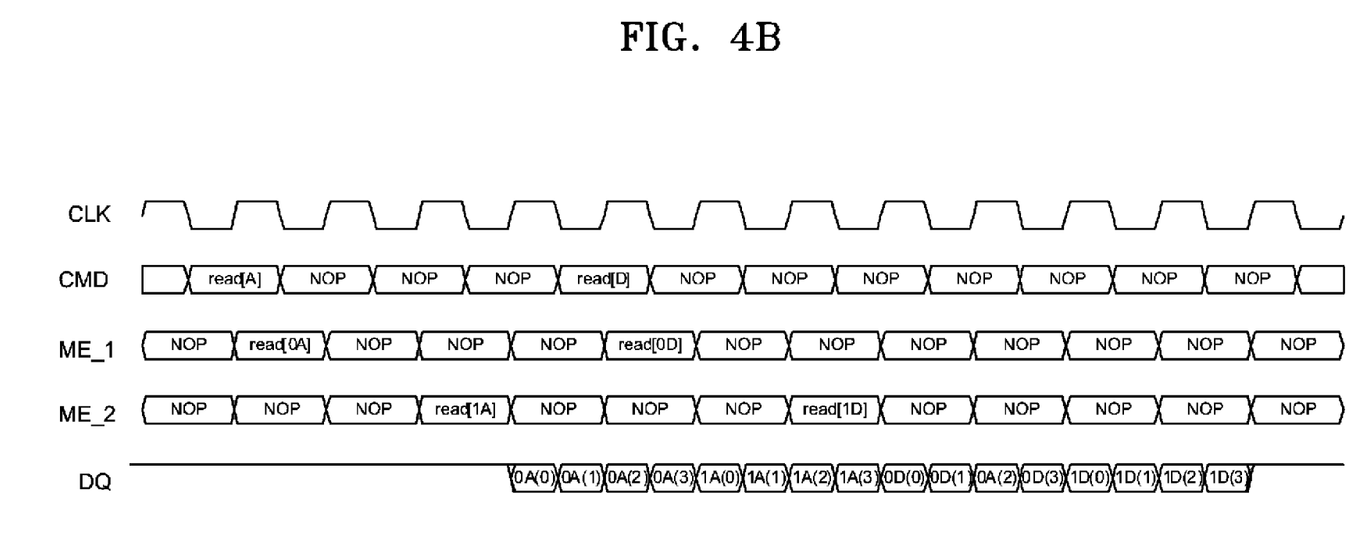
FIG. 4B is waveform diagram showing certain signals applied to the multi-chip memory device of FIG. 1 given a data burst length of 8.

FIG. 4B is a waveform diagram illustrating signals for the multi-chip memory device 100 of FIG. 1 assuming a burst length of 8. Here again, a first read command read[A] and a second read command read[D] are sequentially provided. These read operations are handled in a manner similar to those described above, except 4 bits of data are read from each set of banks (0A, 1A) and (0D, 1D). Because the burst length is 8, each read operation is delayed by the delay units 311__x, 312__x and 313__x, as shown in FIG. 4A.

Figure 5A:
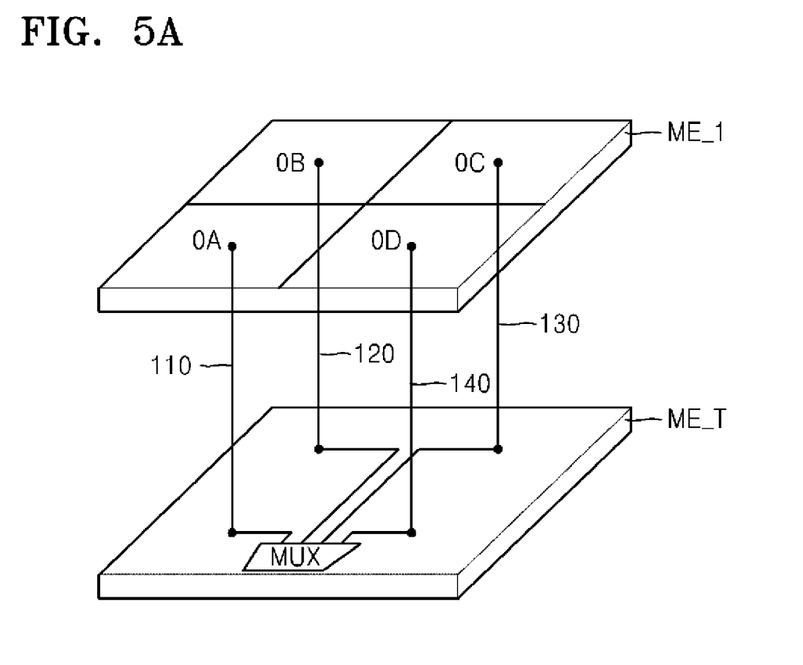
FIG. 5A illustrates an exemplary data path between a transfer memory chip and a memory array of a related semiconductor memory chip in a stacked memory device.

FIG. 5A illustrates an exemplary signal path between the transfer memory chip ME_T and 1st memory chip ME_1.

With reference to FIGS. 1 and 5A, the transfer memory chip ME_T comprises a mux circuit (MUX) receiving data communicated via first through fourth signal paths 110, 120, 130 and 140. That is, data read from each bank (0A, 0B, 0C, and 0D) of the memory array provided by 1st memory chip ME_1 is communicated via a corresponding signal path connected to the MUX for processing before being provided to external circuitry.

Figure 5B:
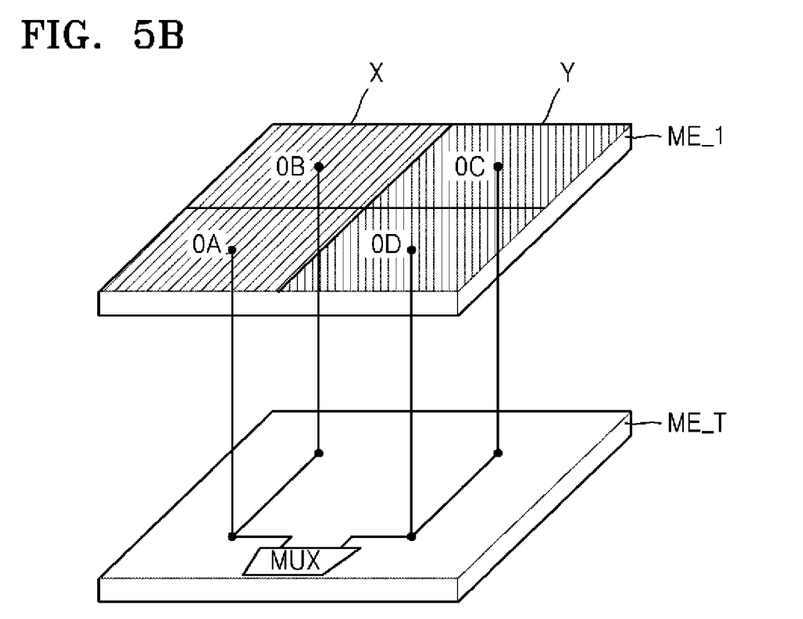
FIG. 5B illustrates an exemplary data path between a transfer memory chip and a memory array divided into bank groups of a related semiconductor memory chip in a stacked memory device.

FIG. 5B illustrates an exemplary signal path between the transfer memory chip ME_T and the 1st memory chip ME_1 where the memory array provided by the 1st memory chip ME_1 is further designated into dual bank groups X and Y.

With reference to FIGS. 1 and 5B, the memory array of first memory chip ME_1 (as an example of other memory chips in a stacked plurality of memory chips) has been divided into 1st through Mth bank groups (here, X and Y), each including at least one of a plurality of the banks previously designated. Hereinafter, a case where the 1st memory chip ME_1 comprises a 1st bank group X (including first and second banks 0A and 0B) and a 2nd bank group Y (including third and fourth banks 0C and 0D), as illustrated in FIG. 5B, will be described.

When the multi-chip memory device 100 performs a second read/write operation after performing a previous first read/write operation directed to data stored in the 1st bank group, it performs the second read/write operation using the 2nd bank groups (i.e. a bank group other than the 1st bank group). For example, in FIG. 5B, when data is read from bank 0A or bank 1A during a first read operation, a "next executed" read operation (i.e., a second read operation immediately following the first read operation) must be directed to data stored in another bank group (here the 2nd bank group Y, or data stored in a bank among banks 0C, 0D, 1C and 1D belonging to the 2nd bank group). Thus, once bank groups are established and corresponding signal paths are connected in the manner shown in FIG. 5B, the MUX in the transfer memory chip ME_T controlling external data communication will alternately receive data from an X signal path and a Y signal path in relation to a current and next read operation. Since data is not continuously output from banks in the same bank group for immediately following read operations, a data line may be shared between the banks (for example, 0A and 0B) belonging to the same bank group. However, since data can be continuously output in the banks belonging to the different bank groups, the banks (for example, 0A and 0C) belonging to the different bank groups are connected through the mux MUX.

FIG. 5B illustrates the case where the 1st bank group includes the banks 0A and 0B and the 2nd bank group includes the banks 0C and 0D. However, the bank groups may be formed by different combinations. For example, the 1st bank group may include the banks 0A and 0C and the 2nd bank group may include 0B and 0D.

Figure 6:
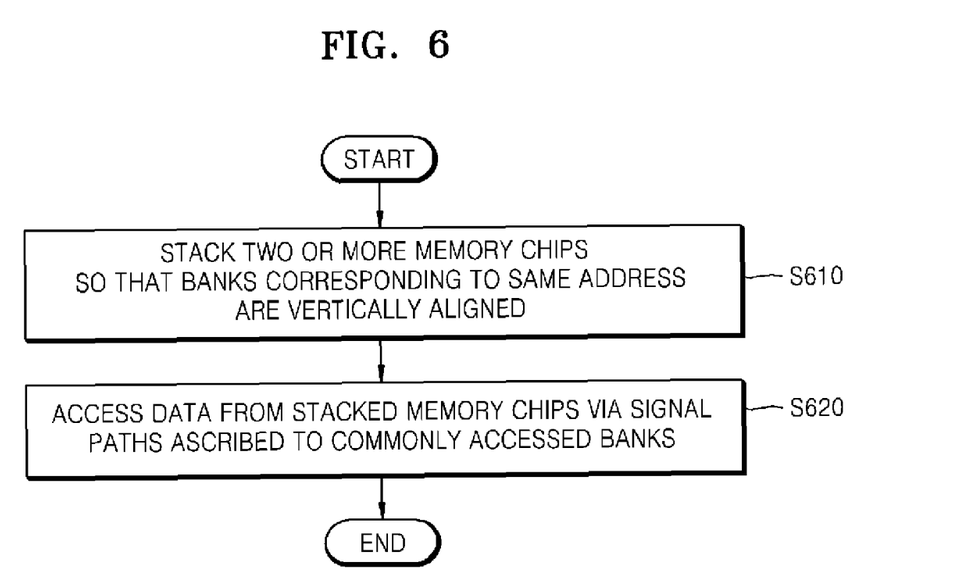
FIG. 6 is a flow chart summarizing a method of stacking memory chips within a multi-chip memory device according to an embodiment of the invention.

FIG. 6 is a flow chart summarizing a method of fabricating and subsequently operating a multi-chip memory device comprising a stacked plurality of memory chips according to an embodiment of the invention.

With reference to FIG. 6, a transfer memory chip communicating input/output signals from a stacked plurality of memory chips is mounted on a PCB. Then, 1st through Nth memory chips are stacked on the transfer memory chip, such that designated banks corresponding to (i.e., accessed by) a similar address are vertically aligned within the stack (S610). Thereafter, at least one signal path is provided upward from the transfer memory chip through the stack to access data stored in commonly accessed (i.e., vertically aligned) banks (S620).

Figure 7A:
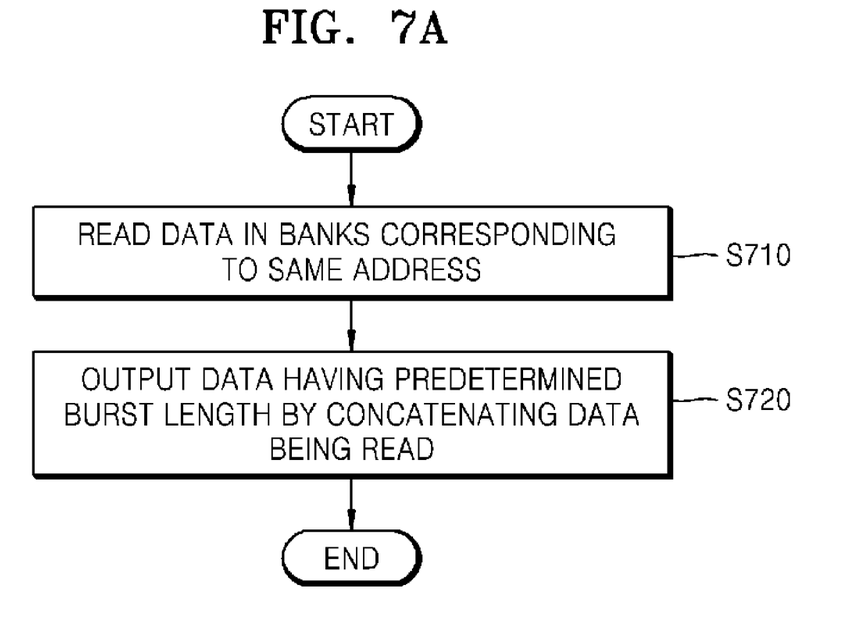
FIG. 7A is a flow chart summarizing a method controlling a read operation for a multi-chip memory device according to an embodiment of the invention.

FIG. 7A is a flow chart summarizing a method of controlling a read operation applied to a multi-chip memory device according to an embodiment of the invention.

With reference to FIGS. 1 and 7A, a read operation is sequentially executed over a series of commonly addressed and vertically aligned banks provided by a stacked plurality of memory devices in a multi-chip memory device (S710). Then, the read data thus obtained on a block by block basis from respective banks is concatenated for output in accordance with a defined burst length (S720).

Figure 7B:
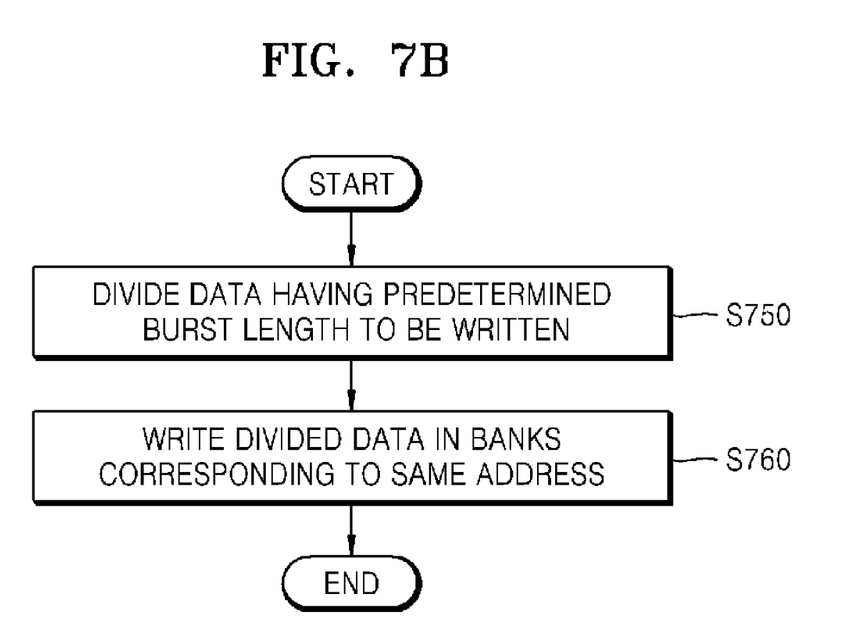
FIG. 7B is a flow chart summarizing a method controlling a write operation for a multi-chip memory device according to an embodiment of the invention.

FIG. 7B is a flow chart summarizing a method of controlling a write operation applied to a multi-chip memory device according to an embodiment of the invention.

With reference to FIGS. 1 and 7B, the multi-chip memory device 100 receives write data from an external source and divides the write data into a plurality of blocks in accordance with a defined burst length (S760). Then, each data block is sequentially written to a corresponding bank, wherein each bank is commonly addressed and vertically aligned with other banks receiving data blocks and provided by a stacked plurality of memory deices in a multi-chip memory device (S760).

Figure 8:
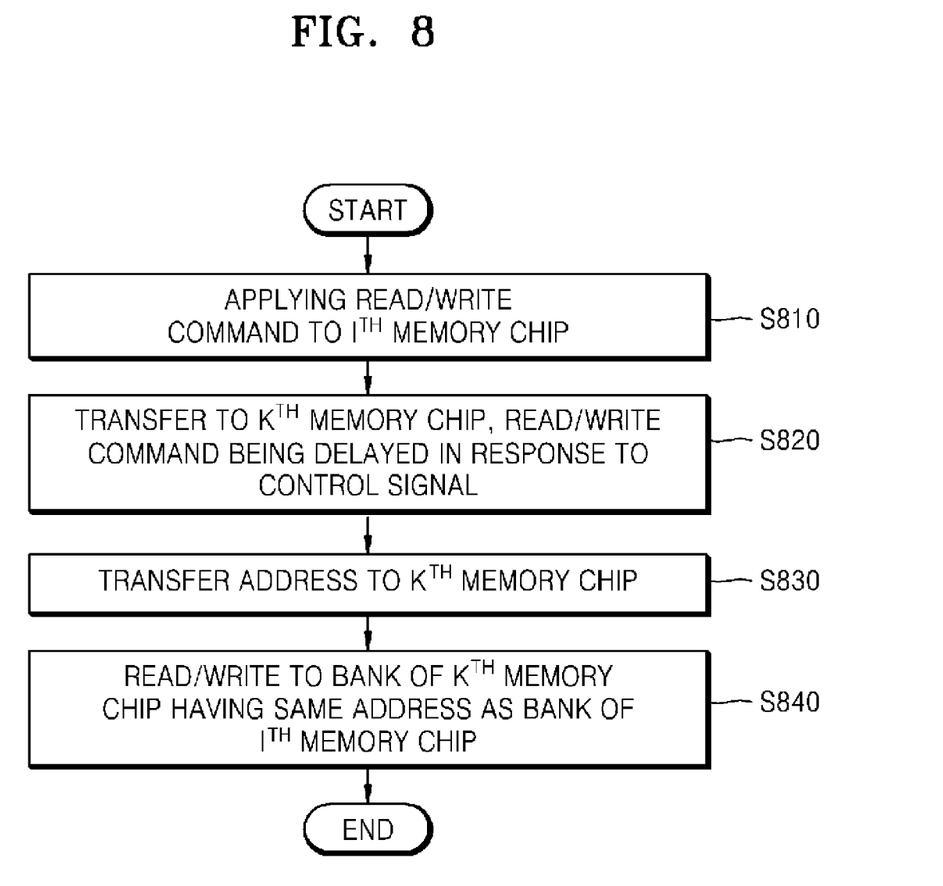
FIG. 8 is a flow chart summarizing a method controlling overall operation of a multi-chip memory device according to an embodiment of the invention.

FIG. 8 is a flow chart summarizing an overall method of controlling the operation of a multi-chip memory device according to an embodiment of the invention.

With reference to FIGS. 1, 3 and 8, a read/write command CMD and corresponding address ADDR are externally applied to a transfer memory chip and then communicated to an I-th memory chip (e.g., a lowermost or uppermost memory chip in the stack of memory chips according to various embodiments) (S810). Then, the read/write command is communicated to a K-th memory chip in the stack of memory chips (e.g., a memory chip above or below the I-th memory chip) (S820). In the foregoing embodiment, command control unit 310_1 delays application of the read/write command CMD in response to the control signals BL2, BL4 and BL8 corresponding to the extent of delay. Then, the address transfer unit 350_1 stores the address ADDR in response to the read/write command CMD, and thereafter, transfers the address ADDR to the K-th memory chip in response to the delayed read/write command (S830). And then, the read/write operation is executed in relation to data stored (or to be stored) in a bank vertically aligned and commonly addressed with a corresponding bank in the I-th memory chip (S840).

The foregoing embodiments are presented as teaching examples of the invention. It will be understood by those skilled in the art that various changes may be made to the details of these embodiments without departing from the scope of the present invention as defined by the following claims.

What is claimed is:

1. A multi-chip memory device comprising:
   a transfer memory chip communicating input/output signals;
   a stacked plurality of memory chips disposed on the transfer memory chip, wherein each stacked memory chip comprises a memory array having a plurality of banks, each bank being vertically aligned with a corresponding bank of the plurality of banks in another stacked memory chip; and
   a plurality of signal paths extending from the transfer memory chip through the stacked plurality of memory chips, each signal path communicating at least one of the input/output signals to corresponding vertically aligned banks in the stacked plurality of memory chips;
   wherein the vertically aligned banks in the stacked plurality of memory chips are commonly addressed to provide read data during a read operation and receive write data during a write operation.

2. The multi-chip memory device of claim 1, wherein each signal path comprises a through silicon via (TSV) formed through a substrate of one of the stacked plurality of memory chips.

3. The multi-chip memory device of claim 1, wherein the at least one of the input/output signals comprises at least one of a read/write command, an address corresponding to the read/write command, a clock signal associated with the read/write command, and data associated with the read/write command.

4. The multi-chip memory device of claim 3, wherein the read/write command is associated with a burst length defining a number of data bits provided by the read operation or a number of data bits associated with write data associated with the write operation.

5. The multi-chip memory device of claim 4, wherein the stacked plurality of memory chips comprises N memory chips and the burst length defines B data bits, and in response to the read operation, each commonly addressed bank in the N memory chips provides a data block of B/N bits to the transfer memory chip via the corresponding signal path.

6. The multi-chip memory device of claim 4, wherein the stacked plurality of memory chips comprises N memory chips and the burst length defines B data bits, and in response to the write operation, each commonly addressed bank in the N memory chips receives a data block of B/N bits from the transfer memory chip via the corresponding signal path.

7. The multi-chip memory device of claim 1, wherein the stacked plurality of memory chips comprises first and second memory chips and the first memory chip comprises:
   a command control unit delaying application of either a read command associated with the read operation or write command associated with the write operation to the second memory chip in response to a delay control signal, and thereafter communicating the delayed read command or write command to the second memory chip; and
   an address transfer unit transferring an address associated with the read command or the write command to the second memory chip when the command control unit communicates the delayed read command or write command to the second memory chip.

8. The multi-chip memory device of claim 7, wherein the delay control signal is defined in relation to a burst length for data provided by the read operation.

9. The multi-chip memory device of claim 8, wherein either one of the first memory chip or second memory chip comprises a register storing information corresponding to the burst length.

10. The multi-chip memory device of claim 7, wherein the command control unit comprises:
   a plurality of delay units delaying the read command or the write command in response to the delay control signal, wherein each delay unit comprises:
   a logic operation unit responsive to the delay control signal and the read command or the write command; and
   a flip-flop delaying an output signal of the logic operation unit.

11. The multi-chip memory device of claim 7, wherein the address transfer unit communicates the address to the second memory chip in response to the delayed read command.

12. The multi-chip memory device of claim 7, wherein the address transfer unit comprises:
- an address storage unit storing the address in response to the read command or the write command applied to the second memory chip; and
- an address control unit controlling output of the stored address such that the stored address is communicated to the second memory chip in response to the delayed read command or write command.

13. The multi-chip memory device of claim 1, wherein the transfer memory chip is an interface chip mounted on a printed circuit board (PCB) and transferring externally provided signals to the stacked plurality of memory chips.

14. The multi-chip memory device of claim 1, wherein the transfer memory chip comprises a MUX circuit receiving read data communicated by the signal path.

15. A multi-chip memory device comprising:
- a transfer memory chip communicating input/output signals;
- a stacked plurality of N memory chips disposed on the transfer memory chip, wherein each one of the N memory chips comprises a memory array having a plurality of M designated banks; and
- M signal paths respectively extending upward from the transfer memory chip through the stacked plurality of N memory chips to communicate input/output signals to respective, commonly addressed and vertically aligned banks in each one of the N memory chips to provide read data during a read operation and receive write data during a write operation.

16. The multi-chip memory device of claim 15, wherein each one of the M designated banks is arranged in one of L bank groups, wherein L is less than M.

17. The multi-chip memory device of claim 16, wherein the transfer memory chip comprises a MUX circuit connected via a single connection with multiple signal paths associated with banks in at least one of the L bank groups.

18. A method of fabricating a multi-chip memory device, comprising:
- stacking a plurality of N memory chips on a transfer memory chip, wherein each one of the N memory chips comprises a memory array having a plurality of M designated banks; and
- providing M signal paths respectively extending upward from the transfer memory chip through the stacked plurality of N memory chips to communicate input/output signals to respective, commonly addressed and vertically aligned banks in each one of the N memory chips to provide read data during a read operation and receive write data during a write operation.

19. The method of claim 18, wherein each one of the M signal paths is implemented by at least one through silicon via (TSV) formed through a substrate of at least one of the stacked plurality of N memory chips.

20. The method of claim 18, wherein the input/output signals comprise at least one of a read/write command, an address corresponding to the read/write command, a clock signal associated with the read/write command, and data associated with the read/write command.

21. A method of controlling operation of a multi-chip memory device comprising a stacked plurality of N memory chips, wherein each one of the N memory chips comprises a memory array having a plurality of M designated banks, and M signal paths respectively extending upward from a transfer memory chip through the stacked plurality of N memory chips communicates input/output signals to respective, commonly addressed and vertically aligned banks in each one of the N memory chips, the method comprising:
- receiving a read command and a corresponding read address associated with a read operation or receiving a write command and a corresponding write address associated with a write operation in the transfer memory chip;
- using a corresponding one of the M signal paths, commonly addressing one bank of the M designated banks in each one of the stacked plurality of N memory chips using the read address or the write address; and
- in response to the read command, sequentially outputting to the transfer memory chip a block of read data from each one of the commonly addressed banks in each one of the stacked plurality of N memory chips using the corresponding one of the M signal paths, or in response to the write command sequentially writing a block of write data in each one of the commonly addressed banks in each one of the stacked plurality of N memory chips using the corresponding one of the M signal paths.

22. The method of claim 21, wherein each one of the sequentially output blocks of read data has a size determined in relation to a defined burst length.

* * * * *